United States Patent [19]

Yamazaki

[11] Patent Number: 5,208,467
[45] Date of Patent: * May 4, 1993

[54] SEMICONDUCTOR DEVICE HAVING A FILM-COVERED PACKAGED COMPONENT

[75] Inventor: Shunpei Yamazaki, Tokyo, Japan

[73] Assignee: Semiconductor Energy Laboratory Co., Ltd., Atsugi, Japan

[*] Notice: The portion of the term of this patent subsequent to Oct. 15, 2008 has been disclaimed.

[21] Appl. No.: 640,560

[22] Filed: Jan. 14, 1991

Related U.S. Application Data

[63] Continuation of Ser. No. 385,173, Jul. 26, 1989, abandoned.

[30] Foreign Application Priority Data

Jul. 28, 1988 [JP] Japan ................. 63-189314

[51] Int. Cl.$^5$ ............... H01L 23/48; H01L 29/46
[52] U.S. Cl. .................... 257/667; 257/790; 361/421; 174/52.4
[58] Field of Search ............ 357/70, 72, 74; 361/421; 174/52.4

[56] References Cited

U.S. PATENT DOCUMENTS

| | | | |
|---|---|---|---|
| 3,644,801 | 2/1972 | Sheldon | 357/73 |
| 4,001,872 | 1/1977 | Khajezadeh | 357/54 |
| 4,024,570 | 5/1977 | Hartmann et al. | 357/81 |
| 4,486,945 | 12/1984 | Aigoo | 357/73 |
| 4,723,197 | 2/1988 | Takiar et al. | 361/403 |
| 4,777,520 | 10/1988 | Nambu et al. | 357/72 |
| 4,788,583 | 11/1988 | Kawahara et al. | 357/72 |
| 4,845,543 | 7/1989 | Okikawa et al. | 357/67 |
| 4,866,506 | 9/1989 | Nambu et al. | 357/72 |
| 5,057,900 | 10/1991 | Yamazaki | 357/70 |

FOREIGN PATENT DOCUMENTS

| | | | |
|---|---|---|---|
| 0021850 | 2/1983 | Japan | 357/72 |
| 0283855 | 11/1989 | Japan | 357/72 |
| 0106953 | 4/1990 | Japan | 357/72 |

*Primary Examiner*—Rolf Hille
*Assistant Examiner*—David Ostrowski
*Attorney, Agent, or Firm*—Sixbey, Friedman, Leedom & Ferguson

[57] ABSTRACT

A semiconductor device comprising a lead frame, a semiconductor chip on the lead frame, a wiring provided between the lead frame and the semiconductor chip, a silicon nitride film formed on the semiconductor chip, the wire, and the lead frame, and a mold formed from a plastic material to enclose the silicon nitride film therein and having a vent hole formed on the undersurface of the lead frame, so that the lead frame is partly exposed to the outside.

5 Claims, 3 Drawing Sheets

SEMICONDUCTOR DEVICE HAVING A FILM-COVERED PACKAGED COMPONENT

This application is a continuation of Ser. No. 07/385,173, filed Jul. 26, 1989, now abandoned.

BACKGROUND OF THE INVENTION

1. Field of the Invention

The present invention relates to sealing for a semiconductor device.

2. Description of the Prior Art

Conventionally, the final coating of a semiconductor chip (a transistor or a semiconductor device on which transistors are integrated in a plurality of locations, hereinafter referred to as a chip) is carried out at the wafer level. Therefore, an aluminum pad section (usually 100 $\mu$m $\times$ 100 $\mu$m) which is formed subsequently for wire bonding is exposed to the epoxy mold section.

For this reason, in a plastic Dual Inline Package (DIP) comprising a lead frame 37 having a die pad 28 and a stem 35, a chip 26 adhering closely to the die pad 28 and having an aluminum pad 38 for electric connection as shown in FIG. 1, it has been ascertained that silicon nitride 30 has a blocking effect against the influx 33 of moisture (humidity) through a plastic bulk 36, but it is completely ineffective against the influx 34 of moisture along a wire or against the influx 31 of moisture through a crack 32 at the interface of the lead frame 37 and the mold 36. For this reason, the aluminum pad 38 is easily corroded, so that the characteristics of the semiconductor device deteriorate, leading to reduced reliability.

Especially, for example, in the case where the 410B epoxy mold material of the Morton Co. is used for the mold section, large quantities of chlorine remain generally throughout the mold material, and chlorine ions are formed by virtue of the existence of water to react with the aluminum, so that corrosion occurs. Consequently, the aluminum becomes aluminum hydroxide, and wire breaks occur. Therefore, the reliability of the semiconductor device outstandingly deteriorates.

In addition, semiconductor device is completely defenseless against the occurrence of corrosion at the pad section due to the moisture which enters the crack 32 which is easily developed at the bonding surface of the lead frame and the epoxy mold when the frame is bent at the lead section and the tie bar is cut.

Further, when an IC chip molded with these plastics is soldered to a substrate, there is the problem that when heated to about 260° C., the moisture remaining in the inner part of the plastic package turns into steam, expands in the inside of the plastic package, and cracks appear in the plastic package. In the prior art technology known to eliminate this problem, the steam is allowed to escape to the outside of the plastic package through a vent hole provided in the underside of the die pad of the lead frame, whereby the development of cracks is therefore suppressed.

However, when this type of configuration is adopted, the problem arises that when the vent holes are provided, the underside of the die pad of the lead frame is directly exposed to the outside atmosphere, so that corrosion occurs on the underside of the die pad.

Specifically, moisture from the outside atmosphere enters and concentrates in an interface between the mold and the lead frame, and reliability of the semiconductor device is decreased. In other words, cracks are produced in in the mold due to thermal expansion, resulting in corrosion, thereby deteriorating the intimate contact between the mold and the lead frame.

SUMMARY OF THE INVENTION

An object of the present invention is to provide, with due consideration to the drawbacks of such conventional DIPs, a semiconductor device in which a drop in reliability can be prevented.

Another object of the present invention is to provide a semiconductor device in which cracks are prevented from being produced in the mold due to thermal expansion of the mold.

Another object of the present invention is to provide a semiconductor device in which moisture is prevented from entering the mold from the outside atmosphere.

Another object of the present invention is to provide a semiconductor device in which corrosion is prevented in the die pad.

BRIEF DESCRIPTION OF THE DRAWINGS

These and other objects, features, and advantages of the present invention will become more apparent from the following description of the preferred embodiments taken in conjunction with the accompanying drawings, in which the same reference numerals are used for the similar elements.

FIG. 4 (B) is an enlarged front elevational view of the substrate section of FIG. 4(A).

DETAILED DESCRIPTION OF THE PREFERRED EMBODIMENTS

Figure 2:
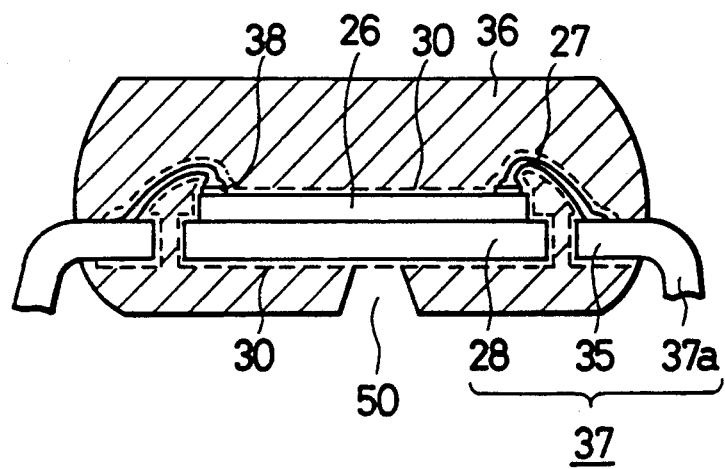
FIG. 2 is a schematic cross sectional view showing an example of the plastic package semiconductor device of the present invention.

Now referring to FIG. 2 which is a schematic vertical sectional view of a plastic DIP of the configuration of the present invention, the plastic DIP comprises a lead frame 37 having a die pad 28 and having an aluminum pad 38, wire bonding of a gold wire 27 provided between the aluminum pad 38 on the chip and the stem 35 of the lead frame 37, and a plastic mold 36 for generally enclosing the members mentioned above.

In addition, the surfaces of the chip 26 including the pad 38, the die pad 28, and the gold wire 27 (in particular the surface adjacent to the pad) are coated with a silicon nitride film 30.

It is further desirable that the top surface of the stem 35 as well as all the wire, and the surface of the wire bonded to it, be coated.

In producing the plastic DIP, the silicon nitride film 30 is formed by the so-called plasma chemical vapor reaction method, the photo-plasma chemical vapor reaction method, or the photo-CVD method, by introducing a silicon compound gas and ammonia into a reaction chamber and supplying electric energy or light energy in it in a temperature range from room temperature to 300° C. and preferably from room temperature to 200° C.

After the silicon nitride film 30 is formed over the entire surface of the lead frame 37 at a thickness of 300 to 2500 Å, and usually about 1000 Å, the silicon nitride film 30 is sealed by means of a commonly known injection molding method and the epoxy (for example, 410B) molding method for the molded package 36. At this time, a vent hole 50 is provided across the thickness of the mold in the underside of the die pad 28. In addition, the lead frame 37 is bent at a lead section 37a and the tie bar is cut. Also, the lead is coated with solder after an acid wash.

Figure 1:
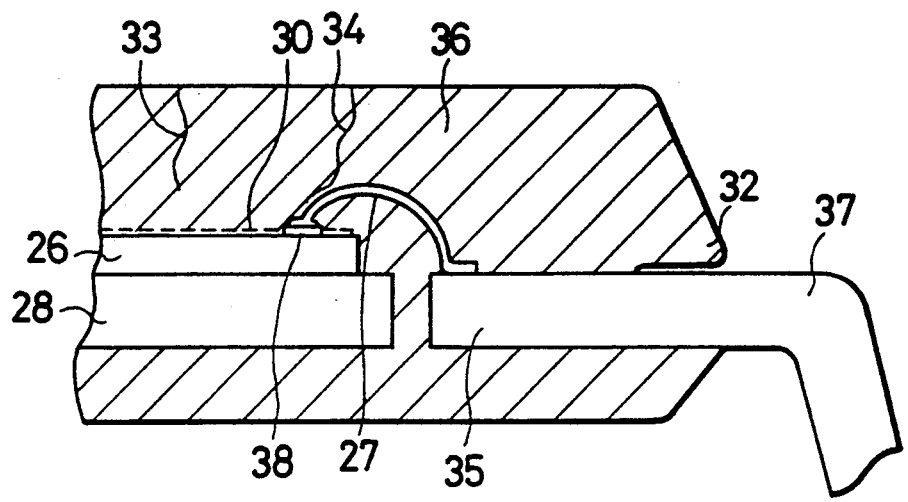
FIG. 1 is an enlarged schematic cross sectional view showing a conventional plastic package semiconductor device.

By such a configuration for the semiconductor device of the present invention, it is possible to prevent corrosion from the influx 33 of moisture through the mold bulk 36, from the influx 34 of moisture along a wire surface 27, and from the influx 31 of moisture through a crack 32 as shown in FIG. 1. Otherwise, these influxes would lower the reliability of the semiconductor device.

In particular, the entire surface of the aluminum pad 38 is not directly in contact with or exposed to the mold material 36, and, in addition, the blocking effect (masking effect) of the silicon nitride film with respect to moisture and chlorine is large. For this reason, even when the semiconductor device of the configuration of the present invention is subjected to a pressure cooker test (PCT) at 10 atmospheres and 150° C. for 100 hours, no failure has been found. A conventional IC chip may have a breakdown ratio of 50 to 100 fits, but it is possible for the semiconductor device of the present invention to have a breakdown ratio of only 5 to 10 fits.

Furthermore, because the silicon nitride film 30 is formed on both surfaces of the lead frame 37, the silicon nitride film 30 is also formed on the die pad section 28 which is exposed to the outside through the vent hole 50 provided therein to allow the steam to escape to the outside, so that the die pad 28 is not directly exposed to the outside atmosphere.

Figure 3:
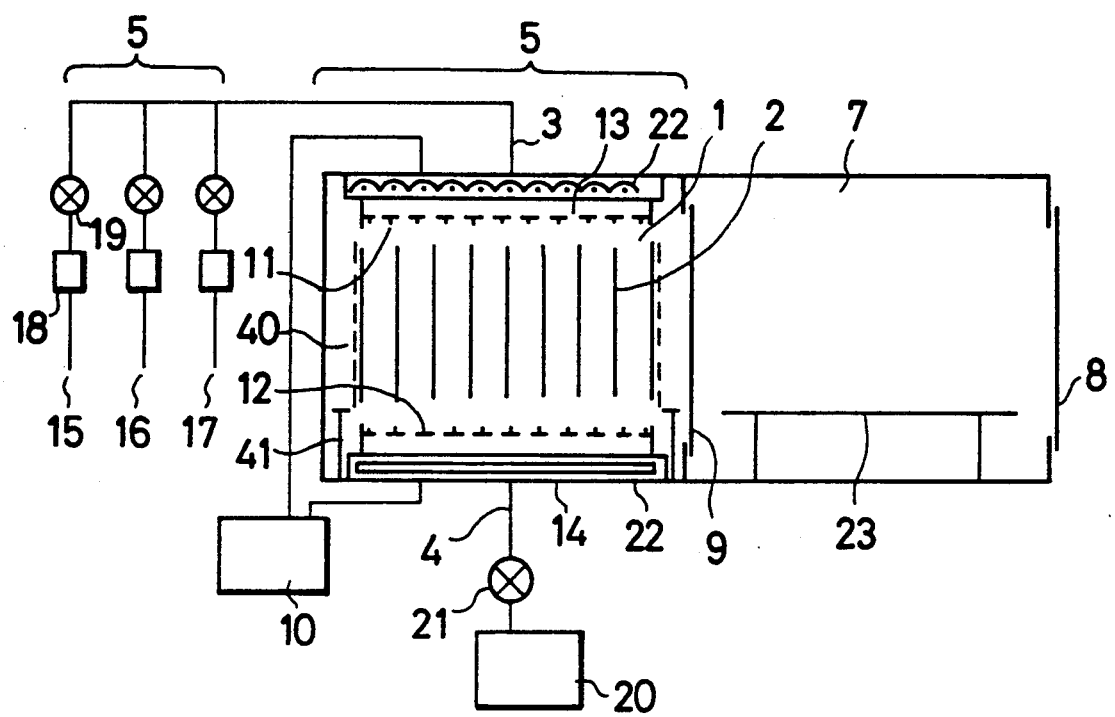
FIG. 3 is a schematic representation showing the outline of a floating plasma chemical vapor reaction device for implementing the present invention.

FIG. 3 shows the outline of an apparatus for coating the silicon nitride film on the structure in which chips are bonded on the lead frames by the plasma CVD method.

A reaction system 6 and a doping system 5 are shown in the drawing.

The reaction system 6 comprises a reaction chamber 1, a spare chamber 7, and a gate valve 8, 9. The reaction chamber 1 is provided with a pair of halogen heaters 22. A supply side hood 13 is provided inside the reaction chamber 1, and a reactive gas from the inlet side 3 is sprayed in the downward direction by means of a nozzle in the hood 13 to cause the reaction and form the film. After the reaction has occurred, the waste gases pass from a discharge side hood 14 through a discharge port 4 to a valve 21 and vacuum pump 20. Electrical energy at a frequency of 100 to 500 kHz from a high frequency power source 10 is supplied to the reactive gases through a pair of screen-shaped electrodes 11, 12. Film-forming bodies 2 (hereinafter referred to as the substrates 2) are arranged each other parallel to at a uniform spacing therebetween (for example, 5 cm) within a frame-structured holder 40 positioned on an insulated supporter 41. The substrates 2 are positioned in positive column glow discharge in a plasma produced by glow discharge and are floated from both of the electrode 11, 12.

The deposition space is limited within the frame-structured holder 40 and between the hoods 13 and 14, so that no flakes are produced inside the reaction chamber.

Because the PCVD method used in the present invention, as shown in FIG. 3, is the floating plasma chemical vapor deposition (FPCVD) method in which the substrates 2 have an electrically floating relationship with the electrodes 11, 12, it exhibits the feature that, even if a conductor is used for part of the substrate 2, the discharge is never unstable.

The doping system 5 supplies silane or dichlorosilane as a silicon compound gas through a line 17, ammonia gas as a nitride gas through a line 16, and nitrogen or hydrogen as a carrier gas through a line 15. These flows are controlled by flow meters 18 and valves 19.

For example, the substrate temperature is held in the range of room temperature $\pm 10°$ C. and the $NH_3/Si_2H_6$ ratio is 20. Also, a 100 W output is supplied from a power source with a frequency of 13.56 MHz. The film is formed under these conditions in about 15 minutes at an average of 1000 Å (1000 Å$\pm$200 Å) in thickness.

The holder 40 comprises a frame having an inside volume of 60 cm $\times$ 60 cm and the distance between the electrodes 11, 12 is 30 cm (effectively 20 cm).

Figure 4:
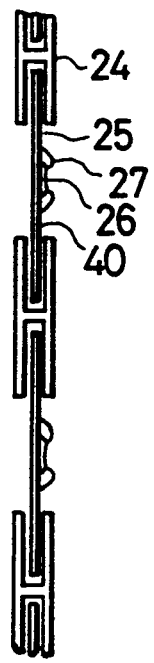
FIG. 4 (A) is an enlarged side elevational view of the substrate section inside the device of FIG. 3.
Figure 4:
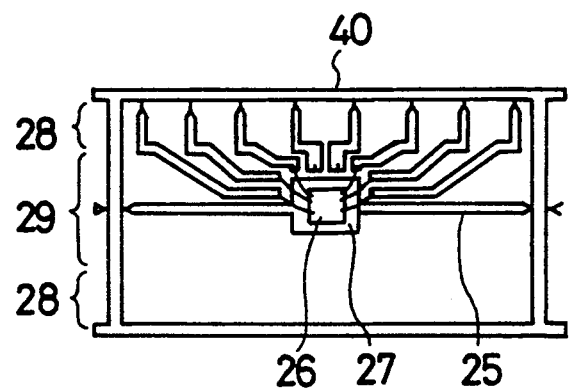

FIG. 4(A) and FIG. 4(B) are an enlarged drawing of part of the substrate 2 of FIG. 3.

In FIG. 4(A), a chip 26 is die attached on a pad of a frame 40 of Covar, and a wire bond 27 is positioned between the aluminum pad of the chip and the stem 25.

At least a lead section of the lead frame 40, is covered by a cover 24 which also supports the frame 40, whereby the silicon nitride film is not formed on the lead section.

Because of the cover 24, the silicon nitride film is formed only in a region 29 as shown in FIG. 4(B). It is extremely important that the silicon nitride film is not formed in the region 28.

The present example has 16 pins as shown in FIG. 4(B), in which the underside of the lead section is omitted. However it is, of course, possible to have an optional number of pins of another shape or of the same shape.

A feature of the FPCVD method of FIG. 3 used in this embodiment of the present invention is that, after the glow discharge is applied and the initial electric charge is charged up on each frame, the charge does not leak, so it is possible to coat a silicon nitride film in the lead frame 40 in exactly the same manner as on an insulating film.

Specifically, in addition to having the feature of coating the silicon nitride film on the lead frame after the wire bonding, there is also the feature that the FPCVD method can be used to coat a film of uniform thickness on the pad and chip surfaces.

In the present invention, in addition to using electrical energy in the FPCVD method, far infrared rays of 10 to 15 μm, or ultraviolet rays of 300 nm or less can be effectively applied at the same time to the deposition space including the substrates in the floating state, which is the photo-CVD (or photo-FPCVD) using light energy.

It is possible to use the photo-CVD method by substituting an ultraviolet light generating source for one of the halogen lamp heating devices 22 in FIG. 3.

In addition, in the example mentioned in FIG. 2, a vent hole 50 is provided to lead the water fraction remaining in the package 36 to the outside of the package 36 and the die pad surface around the vent hole 50 is protected by the silicon nitride, so that corrosion of the lead frame can be prevented, and cracks do not appear in the plastic package during soldering. Therefore, a semiconductor device with long-term reliability can be provided.

Figure 5:
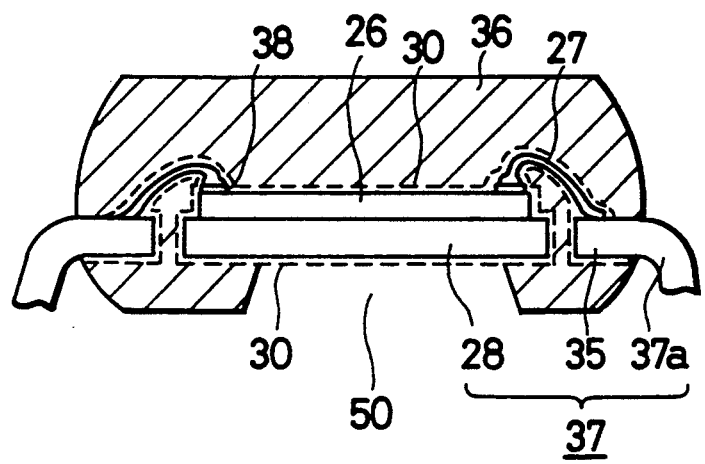
FIG. 5 is a schematic cross sectional view showing another example of the plastic package semiconductor device of the present invention.
Figure 6:
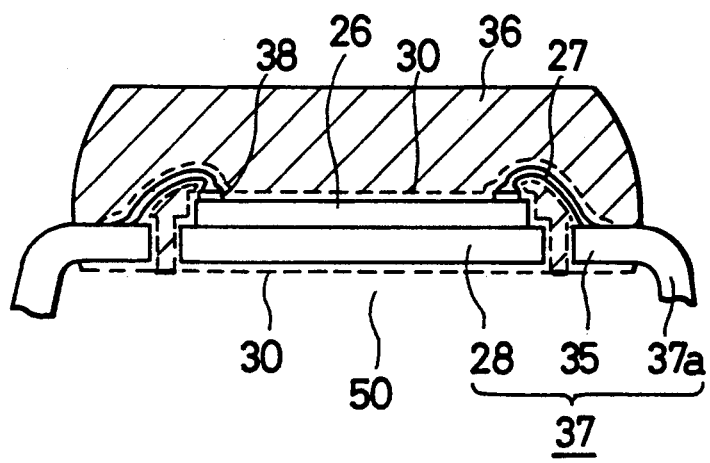
FIG. 6 is a schematic cross sectional view showing another example of the plastic package semiconductor device of the present invention.

FIG. 5 shows that a vent hole having a larger diameter is formed on the underside of the die pad, and FIG. 6 shows that the molded package can be generally eliminated from the underside of the die pad. Accordingly, the vent hole is not limited to the shape as shown in FIG. 1, and the present invention should not be limited by the existence of the vent hole in some examples mentioned above.

By means of the present invention, in the plastic mold structure, corrosion in the aluminum pad or in a lead of 5 to 10 $\mu$m width in a chip or the like can be prevented by coating a silicon nitride film not only on the surface of the chip, but also on the fine gold wire (25 $\mu$m diameter) bonded on a pad for wire bonding, at least in the vicinity of the pad.

Also, in a plastic mold package 36, the semiconductor device of the present invention has high reliability and exhibits a blocking effect against moisture and the like which causes a decrease in reliability, not only against moisture which enters through the bulk of the plastic package 36 but also against moisture which enters along a wire, or moisture which enters along the surface of the lead frame.

In the present invention, the final coating of silicon nitride is not performed at the wafer level, but the chip is die bonded (also referred to as die attaching), and in addition, the silicon nitride coating is applied after the wire bonding is completed, not only on the chip surface, but also on all surfaces of the wire and the aluminum pad simultaneously at a temperature of 300° C. or less, and preferably in the range from room temperature to 250° C., by the plasma chemical vapor method, or the photo chemical vapor reaction method, after which the unit is sealed by the plastic mold process.

Furthermore, the moisture which in the plastic package can escape to the outside of the package through the vent hole, and the die pad which is exposed to the inside through the vent hole is covered with the silicon nitride film. Accordingly, the corrosion of the lead frame is suppressed, and the semiconductor devices have a good reliability in a long time without cracks in the plastic package caused by the soldering.

Since other modifications and changes will be apparent to those skilled in the art, the invention is not considered limited to the examples chosen for purposes of disclosure, and covers all changes and modifications which do not constitute departures from the true spirit and scope of this invention.

What is claimed is:

1. A semiconductor device comprising:
   a lead frame having a stem and a die pad having an undersurface;
   a semiconductor chip positioned on the lead frame and having an aluminum pad for bonding the chip;
   a wire provided for bonding between the aluminum pad and the stem;
   a silicon nitride film having a thickness of 300–2500 angstroms and formed such that the surfaces of the semiconductor chip, the pad, the wire, and the lead frame are covered with the silicon nitride film, and
   a molded package formed from a plastic material to enclose the silicon nitride film covered chip, pad, wire and lead frame therein, with at least part of the undersurface of the die pad of the lead frame exposed outside of the molded package.

2. The semiconductor device of claim 1, wherein said at least part of the undersurface of the die pad is exposed outside of the molded package through a vent hole.

3. A semiconductor device comprising a lead frame, a semiconductor chip on the lead frame, a wiring providing between the lead frame and the semiconductor chip, a silicon nitride film having a thickness of 300–2500 angstroms and generally formed on the semiconductor chip, the wire, and the lead frame, and a molded package formed from a plastic material to enclose the silicon nitride film covered chip, wire and lead frame therein, with at least part of the undersurface of the lead frame exposed to the outside.

4. The semiconductor device of claim 3, wherein said at least part of the undersurface of the lead frame is exposed to the outside of the molded package through a vent hole.

5. The semiconductor device of claim 1, wherein said silicon nitride layer has a thickness of 800–1200 angstroms.

* * * * *